(12) United States Patent
Miyahira

(10) Patent No.: US 7,434,412 B1
(45) Date of Patent: Oct. 14, 2008

(54) COMPUTER EQUIPMENT TEMPERATURE CONTROL SYSTEM AND METHODS FOR OPERATING THE SAME

(75) Inventor: Frank Miyahira, San Mateo, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 360 days.

(21) Appl. No.: 11/261,144

(22) Filed: Oct. 27, 2005

(51) Int. Cl.
*F25B 1/00* (2006.01)

(52) U.S. Cl. ............ 62/115; 62/259.2; 165/104.33; 361/690

(58) Field of Classification Search ............ 62/259.2, 62/407–419, 115; 361/688, 698, 689, 697, 361/690; 165/80.3, 104.33; 454/233, 236, 454/184
See application file for complete search history.

(56) References Cited

U.S. PATENT DOCUMENTS

| | | | | |
|---|---|---|---|---|
| 3,749,981 A | * | 7/1973 | Koltuniak et al. | 361/696 |
| 3,841,393 A | * | 10/1974 | Gilles | 165/210 |
| 4,058,253 A | * | 11/1977 | Munk et al. | 236/46 R |
| 4,158,875 A | * | 6/1979 | Tajima et al. | 361/695 |
| 4,237,521 A | * | 12/1980 | Denker | 361/697 |
| 4,546,619 A | * | 10/1985 | Rohner | 62/419 |
| 5,179,998 A | * | 1/1993 | Des Champs | 165/222 |
| 5,195,576 A | * | 3/1993 | Hatada et al. | 165/80.3 |
| 5,324,229 A | * | 6/1994 | Weisbecker | 454/233 |
| 5,522,768 A | * | 6/1996 | Brodt et al. | 454/234 |
| 5,813,243 A | * | 9/1998 | Johnson et al. | 62/259.2 |
| 6,034,870 A | * | 3/2000 | Osborn et al. | 361/690 |
| 6,131,653 A | * | 10/2000 | Larsson | 165/228 |
| 6,525,936 B2 | * | 2/2003 | Beitelmal et al. | 361/695 |
| 6,628,520 B2 | * | 9/2003 | Patel et al. | 361/696 |
| 6,904,968 B2 | * | 6/2005 | Beitelmal et al. | 165/247 |
| 6,909,606 B2 | * | 6/2005 | Barsun et al. | 361/698 |
| 7,184,267 B2 | * | 2/2007 | Patel | 361/692 |
| 7,226,353 B2 | * | 6/2007 | Bettridge et al. | 454/184 |
| 7,286,351 B2 | * | 10/2007 | Campbell et al. | 361/696 |
| 2003/0213853 A1 | * | 11/2003 | Demster | 236/49.3 |
| 2004/0025515 A1 | * | 2/2004 | Evans | 62/3.2 |
| 2004/0252455 A1 | * | 12/2004 | Yi-Lung | 361/687 |
| 2006/0174560 A1 | * | 8/2006 | Levine et al. | 52/200 |
| 2007/0205297 A1 | * | 9/2007 | Finkam et al. | 236/1 C |

* cited by examiner

*Primary Examiner*—Mohammad M Ali
(74) *Attorney, Agent, or Firm*—Martine Penilla & Gencarella, LLP

(57) ABSTRACT

A system and method for controlling temperature in an equipment enclosure are disclosed. The system includes an enclosure having a top side, side walls, a front side, and a back side. The enclosure is configured to receive computer equipment. Further included is an air mover to draw air into the enclosure at the top side. Cooling panels are coupled to the front side of the sidewalls. The cooling panels are configured to receive the air from the air mover, and the received air is cooled as it travels within the cooling panels. The cooling panels include outlet ports for allowing the air that has been cooled to travel from the front side of the enclosure to the backside of the enclosure.

16 Claims, 10 Drawing Sheets

COMPUTER EQUIPMENT TEMPERATURE CONTROL SYSTEM AND METHODS FOR OPERATING THE SAME

BACKGROUND

The present invention pertains to cooling systems, and more particularly, to apparatus and methods for cooling computer equipment stored in an equipment enclosure.

For example, data storage and processing equipment are stored and operated in equipment enclosures located in data centers. The operation of data storage and processing equipment generates waste heat that not only elevates the room temperature in the data centers, but also can degrade the performance of the data storage and processing equipment. Accordingly, data centers are equipped with ventilation and air conditioning systems to remove waste heat to maintain the desired room temperature in the data centers and keep the data storage and processing equipment operating efficiently without overheating. However, as data storage and processing equipment become more complex and operate at higher speed and greater capacity, more waste heat is generated. In order to keep the data storage and processing equipment operating efficiently without overheating, greater demands are put on the facility ventilation and air conditioning systems to remove the excess heat and keep the equipment from overheating. Accordingly, a cooling system is desired to assist with meeting increasing demands.

SUMMARY

Broadly speaking, the present invention provides the systems and methods for efficiently cooling equipment that generates waste heat during operation. More particularly, embodiments of the present invention provide the apparatus and methods to cool equipment stored in an equipment enclosure, e.g., equipment rack in a data center.

In one embodiment, a system for controlling temperature in an equipment enclosure is disclosed. The system includes an enclosure having a top side, side walls, a front side, and a back side. The enclosure is configured to receive computer equipment. Further included is an air mover to draw air into the enclosure at the top side. Cooling panels are coupled to the front side of the sidewalls. The cooling panels are configured to receive the air from the air mover, and the received air is cooled as it travels within the cooling panels. The cooling panels include outlet ports for allowing the air that has been cooled to travel from the front side of the enclosure to the backside of the enclosure.

In another embodiment, a method for controlling temperature in an equipment enclosure is disclosed. The method includes providing an enclosure that is configured to hold computer equipment. Then, conditioning air to a desired cooled temperature and flowing the conditioned air through the enclosure. The conditioned air experiences an elevation in temperature upon passing through the enclosure when holding computer equipment in operation. Then, flowing air out of the enclosure. The air flowing out of the enclosure is less heated due to the conditioning of the air before flowing the air into the enclosure. In this manner, the need and cost to condition the room that holds the computer equipment is reduced or minimized.

Other aspects and advantages of the present invention will become apparent from the following description, taken in conjunction with the accompanying drawings, illustrating by way of examples the principles of the invention.

BRIEF DESCRIPTION OF THE DRAWINGS

The present invention will be readily understood by the following detailed description in conjunction with the accompanying drawings, and like reference numerals designating like structural elements.

DETAILED DESCRIPTION

The present invention, as illustrated by the following embodiments, provides the systems and methods for cooling equipment that generates waste heat during operation. More specifically, embodiments of the present invention provide the apparatus and methods to cool equipment stored in an equipment enclosure located in a data center. As should be appreciated, the present invention can be implemented in numerous ways, including systems or methods. In some instances, well known process operations and components have not been described in detail in order to avoid obscuring the embodiments of the present invention.

Figure 1:
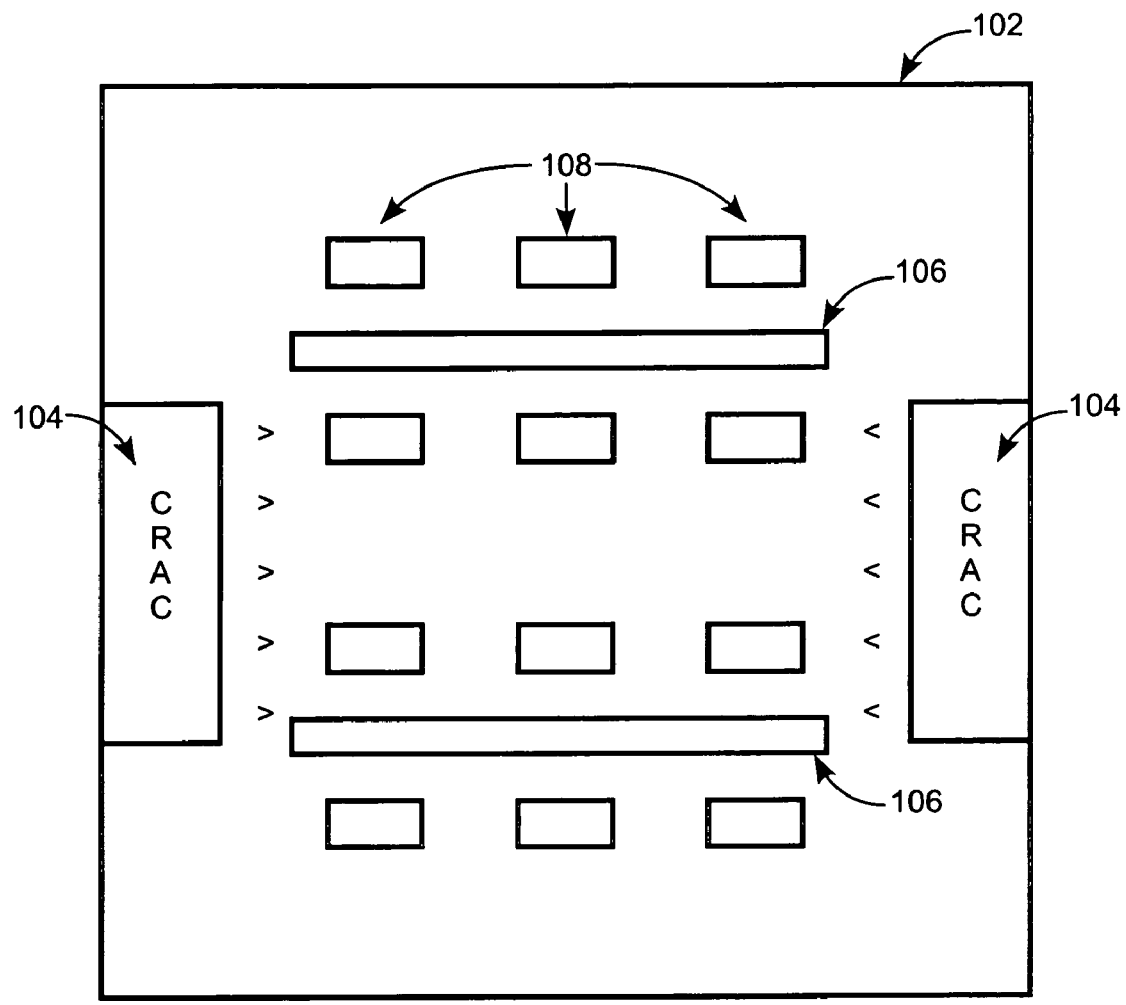
FIG. 1 is a diagram of a top view of a data center.

FIG. 1 is a block diagram of a data center. In FIG. 1, a data center 102 is equipped with two computer room air conditioning (CRAC) systems 104 and two ventilation ducts 106. The CRAC systems 104 provide air temperature control, e.g., cooling, of the data center 102. The ventilation ducts 106 provide air ventilation in to and out of the data center 102. Four rows of equipment enclosures 108 (e.g., equipment racks) are installed in the data center 102. A variety of data storage and processing equipment (e.g., blade servers, etc.) may be stored in the equipment enclosures 108. As the data storage and processing equipment is operated, waste heat is generated as a byproduct of the operation. The ventilation ducts 106 remove some the waste heat generated from the equipment enclosures 108 as well as supplying fresh air into the data center 102. The CRAC systems 104 cool the air in the data center 102 to maintain the room temperature in the data center 102 at a proper level. The data center 102 is, however, only one example of the arrangement of equipment in a room. Thus, data center 102 should be viewed as an example case where measures are taken to address the generated heat.

Figure 2:
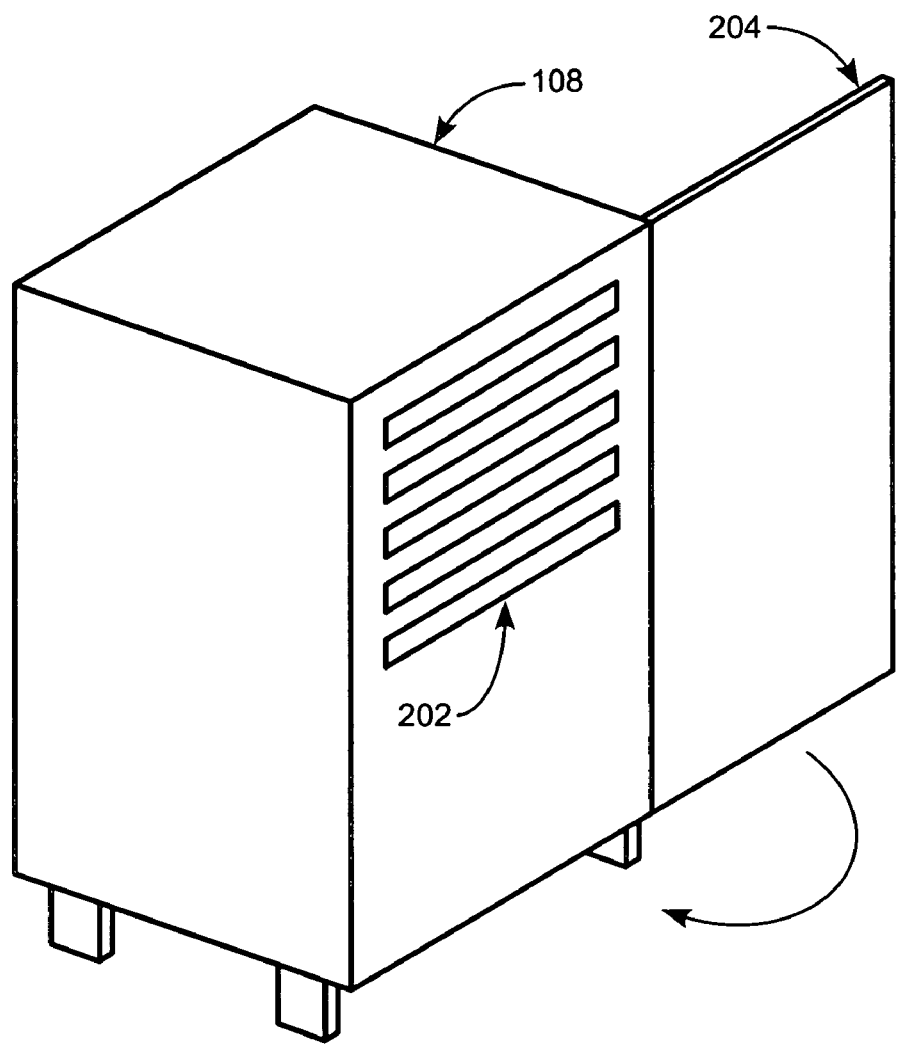
FIG. 2 is a diagram of an isometric view of an equipment enclosure.

FIG. 2 is a diagram of a typical equipment enclosure. In FIG. 2, an equipment enclosure 108 is configured with slots 202 for storing data storage and processing equipment (e.g., blade servers, etc.), and door 204 secures the equipment enclosure 108. Although FIG. 2 shows one particular configuration for storing data storage and processing equipment, the equipment enclosure 108 may be configured in a variety of ways to store data storage and processing equipment. As the data storage and processing equipment is operated, waste heat is generated and exhausted from the equipment enclosure 108 into the data center 102.

Figure 3:
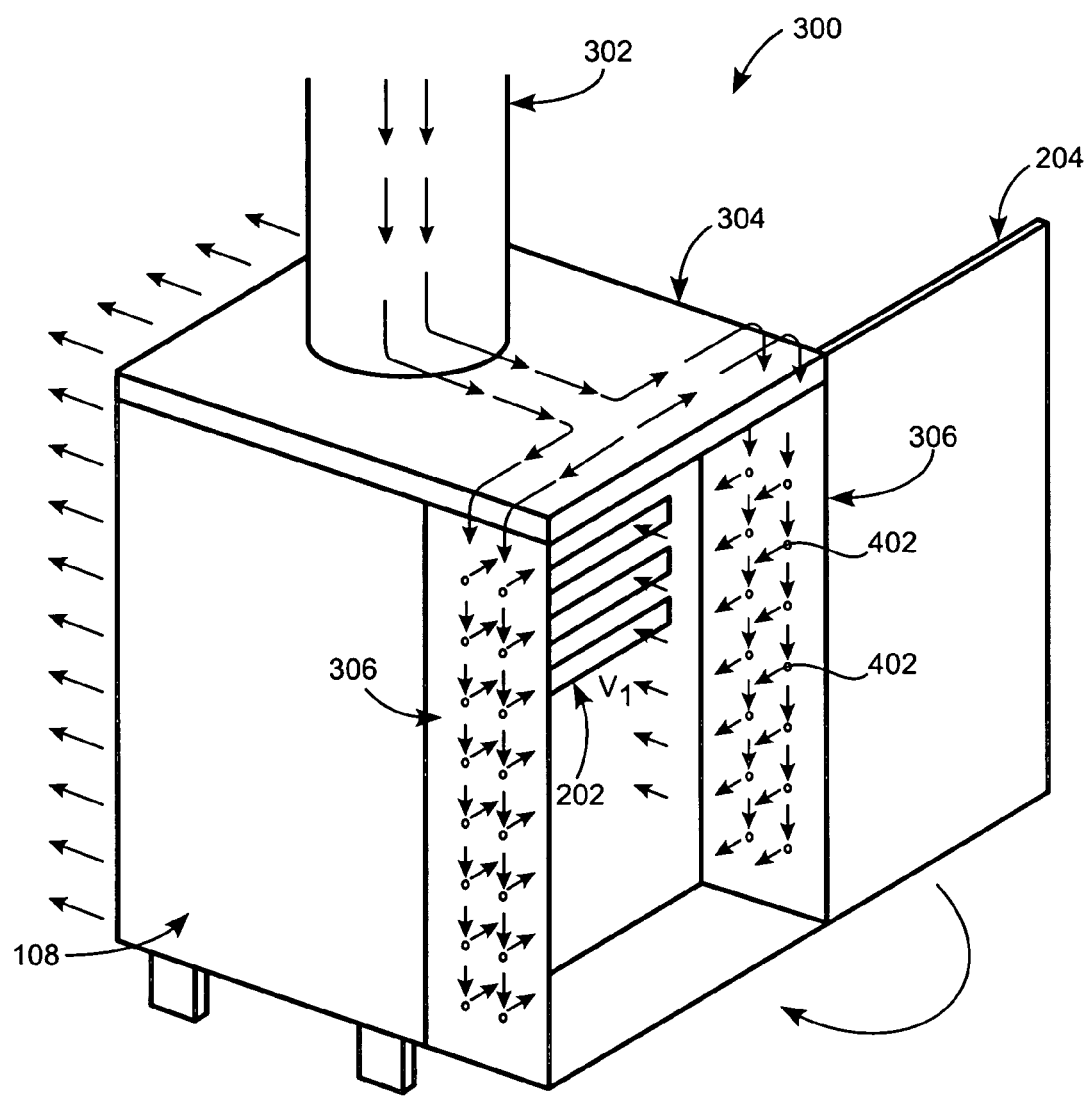
FIG. 3 is a diagram of an isometric view of a cooling system in accordance with one embodiment of the present invention.

FIG. 3 is a diagram of a cooling system in accordance with one embodiment of the present invention. As shown in FIG. 3, a cooling system 300 is mounted to an equipment enclosure 108. The cooling system 300 includes an air mover 302, e.g., fan, blower, etc., which draws air into the cooling system 300. The air mover 302 directs air to a manifold 304 of the cooling system 300. The manifold 304 then splits the air to separate paths, such that air is directed to cooling panels 306.

Although FIG. 3 shows the cooling panels 306 being mounted to the equipment enclosure 108, it is within the scope of the present invention to incorporate the cooling panels 306 as the panels of the equipment enclosure 108. Accordingly, the cooling system 300 may be incorporated as of part of the equipment enclosure, e.g., panels of the equipment enclosure, or as an add-on system that can be attached to the equipment enclosure. When attached to an existing enclosure, the connection can be by way of any desired manner. For instance, the cooling panels can be clipped on, screwed on, welded on, bracketed on, and the like. In some embodiments, the cooling panels 306, when connected to the enclosure, may be optionally coupled with an interfacing gasket.

The air flow is shown traveling down the cooling panels 306 and then directed toward the center area in front of the slots 202. Once the cool air is in front of the slots 202, the cool air is caused to flow through the slots (e.g., into the equipment components). Once the air travels into the equipment and cools the equipment, the air is expelled from the back of the equipment enclosure 108. The air leaving the equipment enclosure 108, which is elevated in temperature, is then channeled to ducts (not shown) that remove the air from the room. In operation, the door 204 may be closed, but typically, the door is not a solid door. The door 204, in many configurations, is a wire mesh or steel door that provides a level of theft security to the installed equipment.

In accordance with an embodiment of the invention, the cooling panels assist in conditioning the air (i.e., cooling the air), before the air is passed into the enclosure. By doing this, the air rises in temperature as it passes through the enclosure (when equipment is in operation). However the air that exits the enclosure will not be elevated. That is, the air that exits the enclosure, although increases in temperature, will exit the enclosure at temperature that is closer to room temperature. For instance, if room temperature is 23-25 degrees C., and the air is cooled to 13-15 degrees C. (in the cooling panels), the air that exits the enclosure may be about 23-25 degrees C. In this example, the rise in temperature between air that goes in to air that comes out of the enclosure is 10 degrees C. Consequently, the cooling of the air in the cooling panels assists in removing the heat that would otherwise be exhausted out of the enclosure. As a comparison to the prior art, the prior art technique is to simply supply air into the enclosure, and then treat the elevated temperature of the room (e.g., data center).

In one embodiment, the cooling panels can supply about 15-18 Kilowatts of cooling capacity. For this capacity, the cooling panels 306 may extend off the enclosure by about 10 inches. Of course, the cooling panels can be increased in size to supply more cooling capacity. The size of the cooling panels 306, will therefore depend on the cooling load (e.g., the amount of heat that can be generated by the computer equipment in the enclosure).

Figure 4:
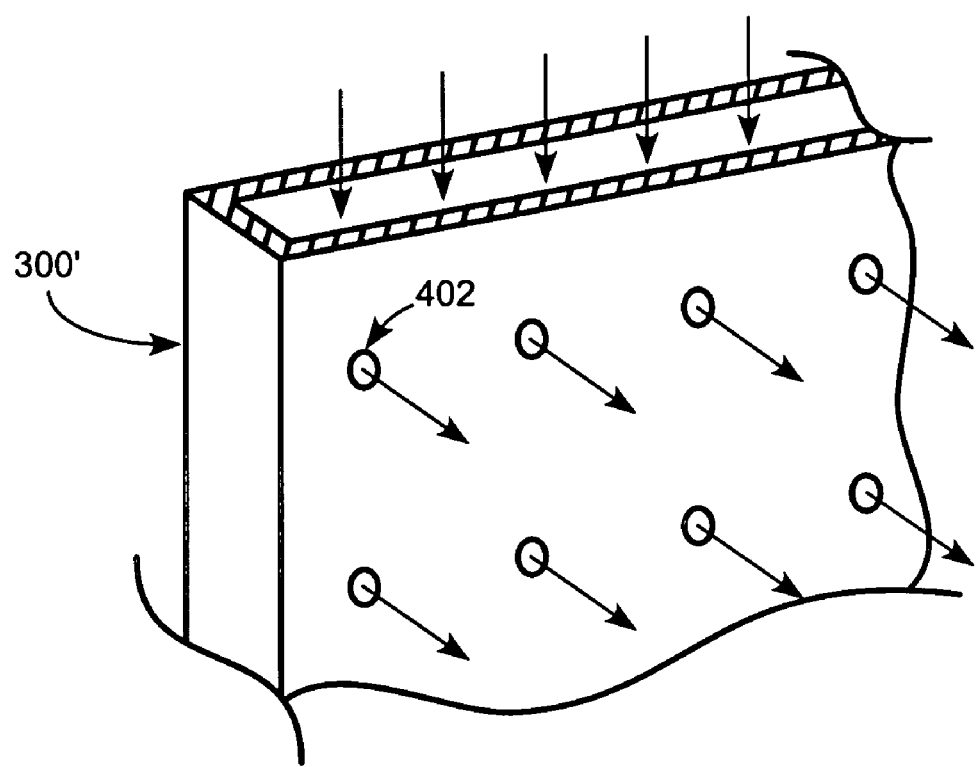
FIGS. 4 and 5 show a diagram of a cut-out section of the cooling panel in accordance with one embodiment of the present invention.

FIG. 4 is a diagram of a cut-out section of the cooling panel 306 in accordance with one embodiment of the present invention. The cooling panel 306 has a path for moving air. The path is defined by the walls of the cooling panel 306. FIG. 4 shows that air is directed from the manifold 304 into the cooling panel 306. Air is ventilated out of the cooling panel 306 through outlet ports 402. As will be discussed further below, the outlet ports 402 may be configured in various manners to facilitate the operation of the cooling system 300. The cooling ports can also be provided with vent controlling louvers. The vent controlling louvers can be manually adjusted or computer controlled (by predefined programs or programs actively receiving sensed feedback data) so that different regions of the cooling panels 306 exhaust air and others do not. For instance, the panels can allow cooled air to exit into the enclosure near the top, and bottom, but not in the center, or in any determined configuration. The determined confirmation would depend on the installed computer equipment, as some equipment may generate more heat that others.

Figure 5:
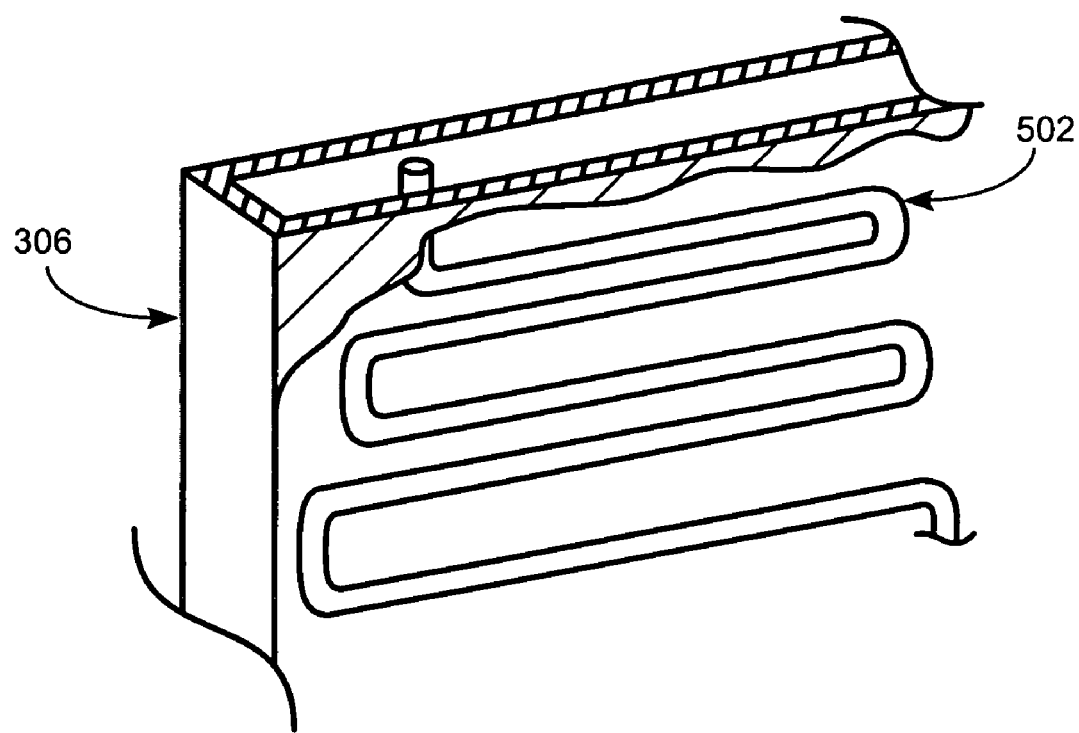

FIG. 5 is a diagram showing a cut-out section of the cooling panel in accordance with one embodiment of the present invention. The cooling panels 306 can include coolant tubes 502, which circulate coolant (e.g., and without limitation, X134A, R134U, CFC refrigerant, etc.) throughout the cooling panels 306. The cooling panels 306 can be of any suitable dimension, but in one example, the cooling panels 306 extend out to about 10 inches and have a thickness of about 1-2 inches. In one embodiment, the dimensions of the cooling panels 306 will allow easy coupling to the enclosure, yet allow for unobstructed installation, removal or servicing of computer equipment (e.g., blade servers, components of any dimension (e.g., 1U, 2U, 3U, 4U, 8U, etc.)).

The coolant tubes 502 may be constructed from a material (e.g., copper coils, micro-channel coils, radiating fins, hollow conductors, or other thermally conducting materials) that is most suitable for maximizing heat transfer between the coolant in the coolant tubes 502 and the air that is being cooled in cooling panel 306. In one embodiment of the present invention, the cooling panels 306 are configured with fins (similar to the configuration of a heat exchanger see FIG. 6) to provide a maximum surface area to facilitate conduction and convection.

Still referring to FIG. 3, each of the cooling panels has a plurality of outlet ports 402 (see FIG. 4 and FIG. 6) to allow air to be ventilated out. In one embodiment of the invention, the outlet ports 402 are configured in such manner that air is ventilated toward the front face of the equipment rack 108 with a velocity $V_1$. The airflow having a velocity $V_1$ is directed toward the front of the equipment enclosure 108. Air flows through the equipment enclosure 108 from the front to the back. As air, which is cooled by the cooling panels 306, passes through the data storage and processing equipment and cools the equipment's heat generating electrical and electrical components, and the waste heat temperature is lowered. Accordingly, the temperature of the waste heat is reduced by the cooled air from the cooling panels 306. The cooled air from the cooling panels 306 not only reduces the heat load to the ventilation and air conditioning systems in the data center 102, but it also cools the data storage and processing equipment.

Figure 6:
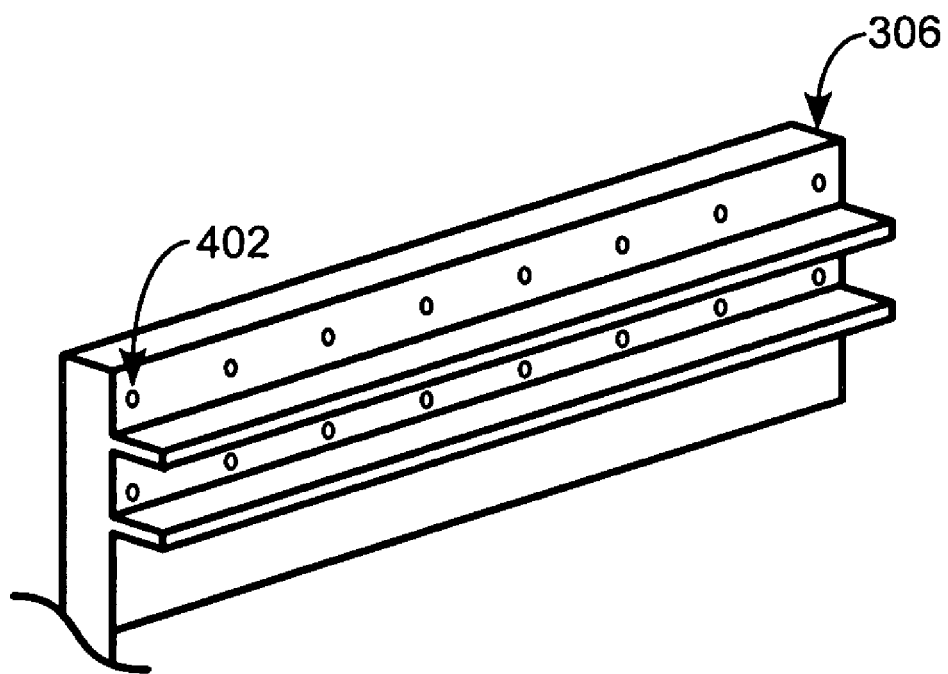
FIG. 6 is a diagram of a cooling panel in accordance with one embodiment of the present invention.

FIG. 6 is a diagram of a cooling panel in accordance with one embodiment of the present invention. Cooling panel 306 is configured with fins to maximize the surface area of the cooling panel for maximum heat transfer between the cooling panel 306 (e.g., by way of the coolant) and the air that is being ventilated from the outlet ports 402. That is, the cooling panels 306 have an outer wall and an inner wall, the inner wall includes the fins for enhancing cooling of the air. The cooled air is directed toward the front face of the equipment enclosure 108. Since the cooled air is ventilated out of the outlet ports 402 with a velocity $V_1$, the cooled air will pass through the equipment enclosure 108, cooling the data storage and processing equipment as the cooled air passes from the front of the equipment enclosure 108 to the back of the equipment enclosure 108.

Figure 7:
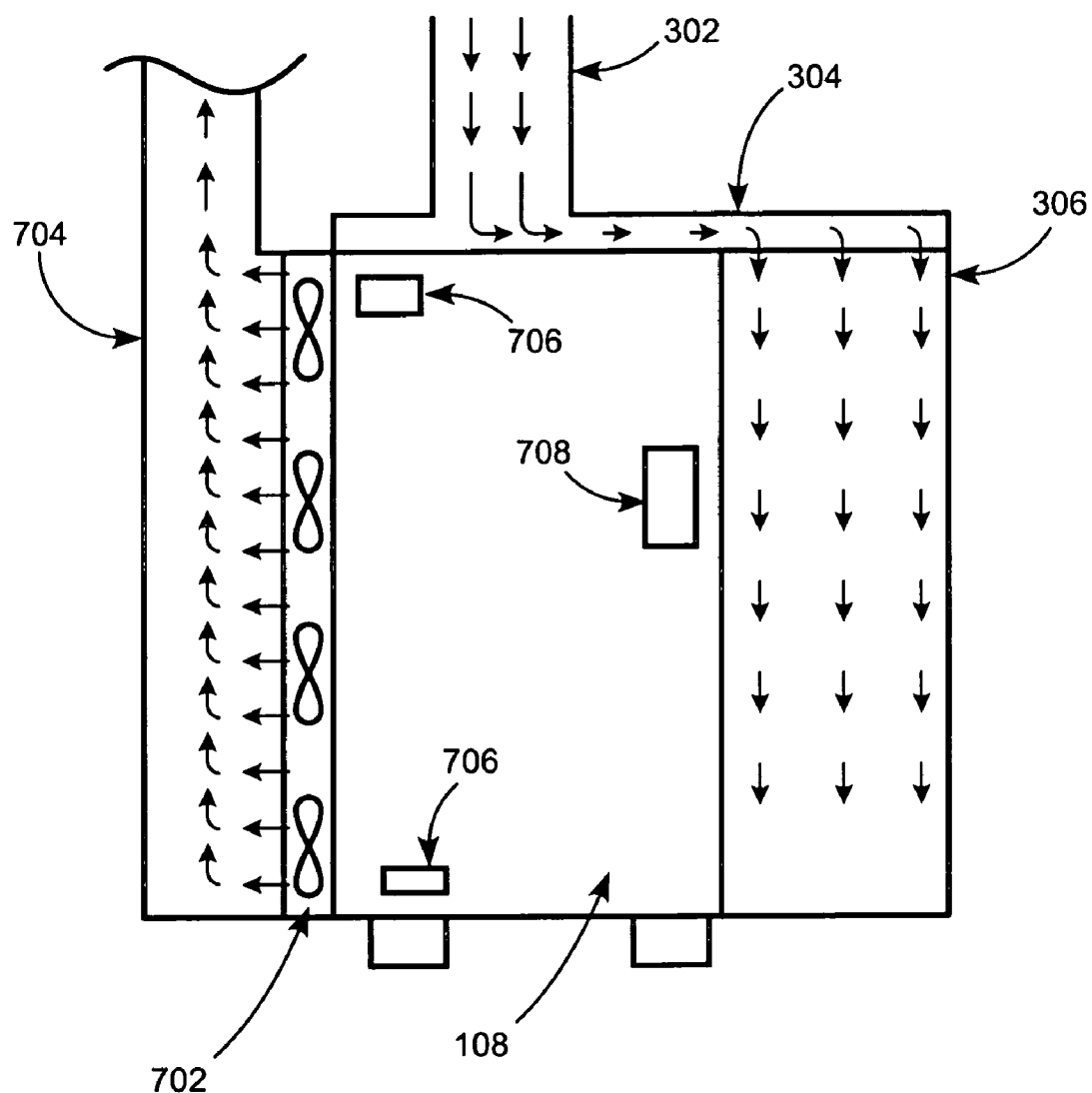
FIG. 7 is a diagram of a side view of a cooling system in accordance with one embodiment of the present invention.

FIG. 7 is a diagram of a cooling system in accordance with another embodiment of the present invention. FIG. 7 shows a second air mover 702 being mounted to the equipment enclosure 108 to facilitate the cooled air from the cooling panels 306 to pass through the equipment enclosure 108. The second air mover 702 draws the cooled air through the equipment enclosure 108 to the exhaust duct 704. Thus, in this embodiment of the present invention, the equipment enclosure 108 might be considered as a self-contained unit. That is, the equipment enclosure 108 may not require cooling from the ventilation and air conditioning systems in the data center 102 to maintain the interior temperature of the equipment enclosure 108 at a proper level. The cooling system as described in this embodiment is able to provide cooled air to cool the data storage and processing equipment in the equipment enclosure 108. At the same time, the cooling system is capable of exhausting away any waste heat by way of the duct 704 without loading the ventilation and air conditioning system of the data center 102.

In another embodiment of the present invention, the cooling system 300 includes temperature and airflow monitoring components 706 and cooling system controller 708. The cooling system controller 708 is configured to control the cooling system 300. The temperature and airflow monitoring component 706 monitors the interior temperature and airflow in the equipment enclosure 108 and transmit temperature and airflow information to the cooling system controller 708. The cooling system controller 708 is configured to controller the air mover 302, the circulation of the coolant in the cooling panels 306, the ventilation of cooled air through the outlet ports 402, and the second air mover 702, such that the cooling system 300 is properly cooling the data storage and processing equipment in the equipment enclosure 108 and removing waste heat generated by the operation of the data storage and processing equipment.

For example, the cooling system controller 708 is capable of controlling the air mover 302 to regulate the amount of air that is being drawn into the cooling system 300. Also, the cooling system controller 708 is capable of controlling the circulation of coolant through the cooling tubes 502 in the cooling panels 306 to regulate the cooling capacity of the cooling panels 306. The cooling system controller 708 can also control the amount of cooled air that is being ventilated through the outlet ports 402 to regulate the airflow through the equipment enclosure 108. In addition, the cooling system controller 708 can control the air mover 702 to regulate the draw from the air mover 702 to assist with the cooled air passing through the equipment enclosure 108. Accordingly, the cooling system 300 is capable of maintaining the interior temperature of the equipment enclosure 108, such that the data storage and processing equipment can perform at peak efficiency without loading the ventilation and air conditioning system in the data center 102.

Figure 8A:
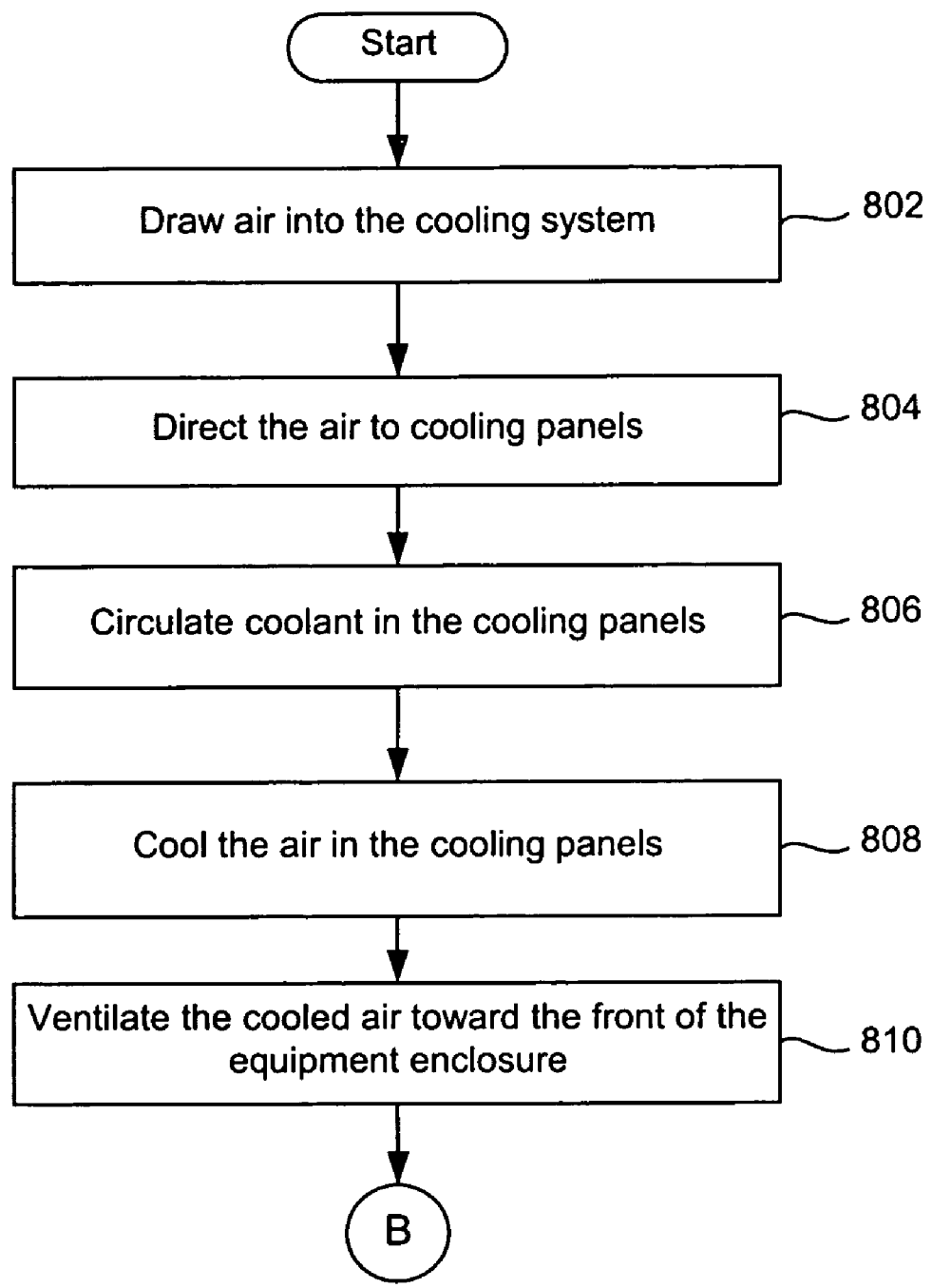
FIG. 8A is a flowchart detailing a process of operating a cooling system in accordance with one embodiment of the present invention.

FIG. 8A is a flow chart detailing a process of operating a cooling system in accordance with one embodiment of the present invention. The operating of the cooling system begins by drawing air into the cooling system by an air mover, in operation 802. As air is drawn into the cooling system, air is directed to cooling panels by a manifold, in operation 804. Coolant is circulated in the cooling panels to cool the cooling panels, in operation 806. Air is directed to cooling panels to cool the air, in operation 808. Cooled air is ventilated toward the front face of the equipment enclosure through outlet ports configured in the cooling panels, in operation 810.

Figure 8B:
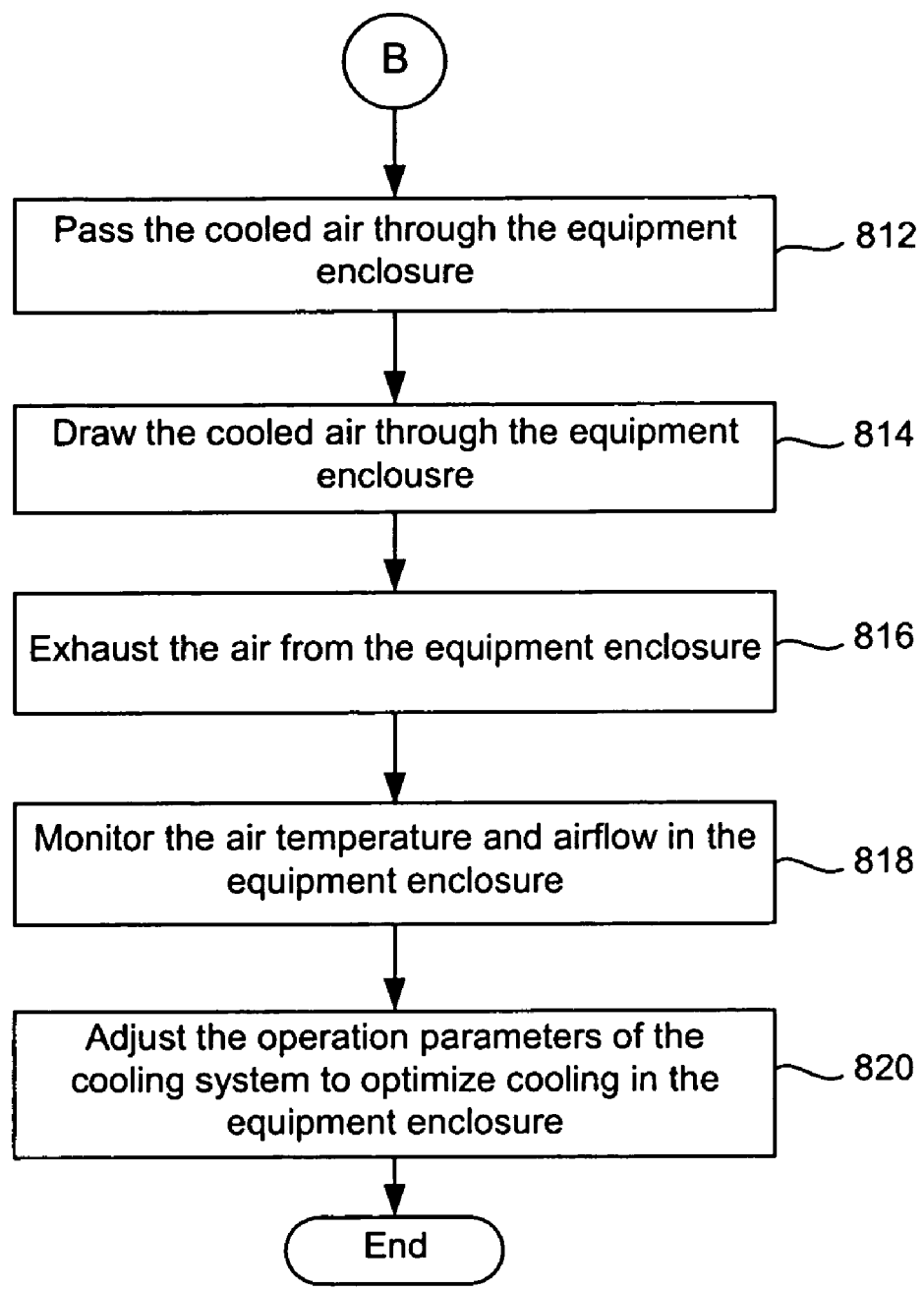
FIG. 8B is a continuation of the flowchart 8A detailing a process of operating a cooling system in accordance with one embodiment of the present invention.

FIG. 8B is a continuation of the flow chart in FIG. 8A. Cooled air is passed through the equipment enclosure cooling data storage and processing equipment in the equipment enclosure and reducing the temperature of waste heat, in operating 812. Additionally, cooled air is drawn through the equipment enclosure by a second air mover to assist with directing the cooled air through the equipment enclosure, in operation 814. Air is exhausted from the equipment enclosure by way of an exhaust duct in operation 816. Interior air temperature and airflow are monitored to determine the effectiveness of the cooling system, in operation 818. As necessary, the operation parameters of the cooling system are adjusted by the cooling system controller to optimize the performance of the cooling system, in operation 820.

Figure 9:
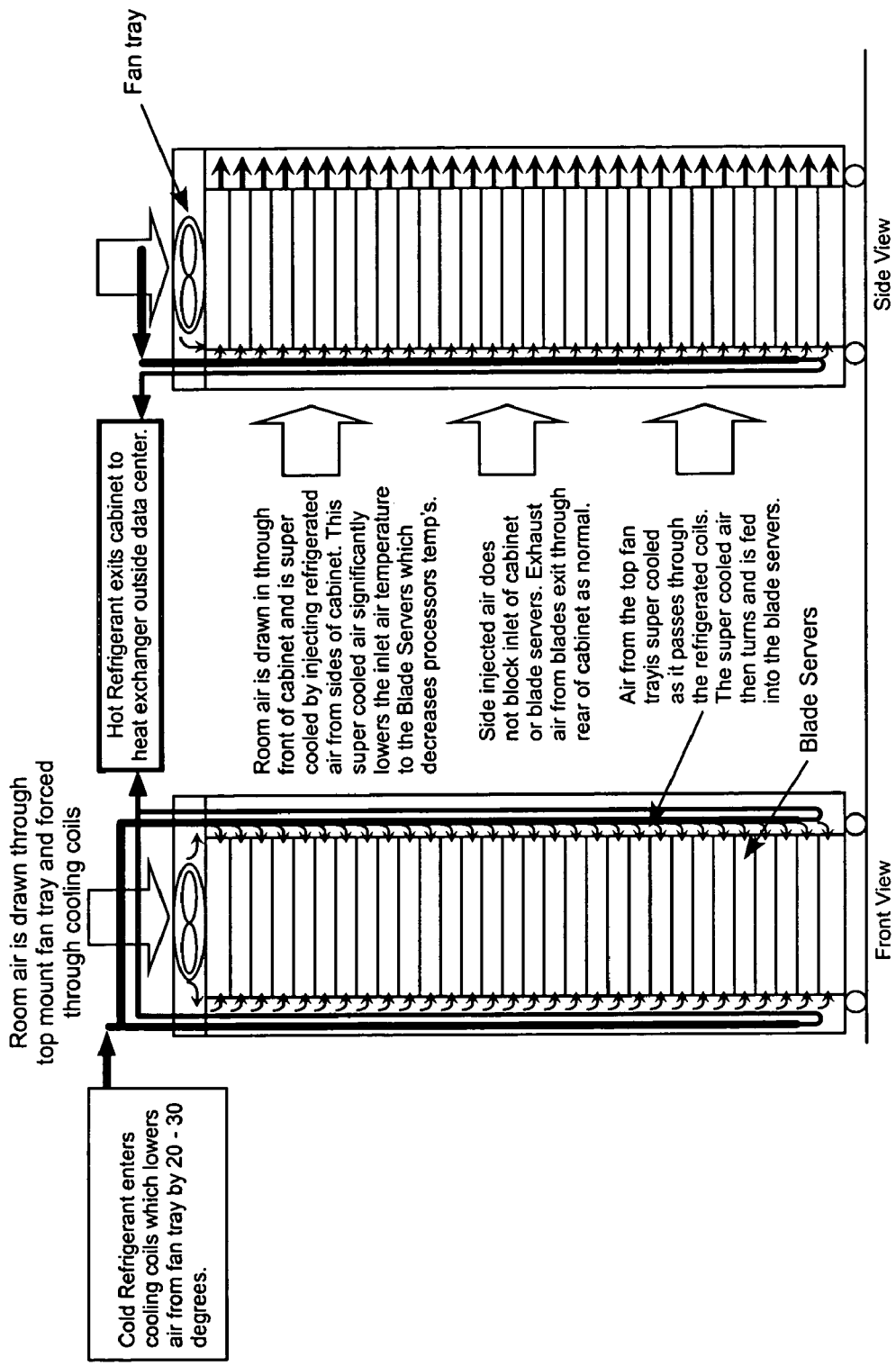
FIG. 9 illustrates front and side views of an enclosure and the air flow lines, in accordance with one embodiment of the present invention.

FIG. 9 illustrates a simplified embodiment of the present invention. As shown, a front view illustrates the flow lines of the air. Also shown is a side view of the same enclosure. The illustration of FIG. 9 will complement the diagram of FIG. 3.

Although a few embodiments of the present invention have been described in detail herein, it should be understood, by those of ordinary skill, that the present invention may be embodied in many other specific forms without departing from the spirit or scope of the invention. Therefore, the present examples and embodiments are to be considered as illustrative and not restrictive, and the invention is not to be limited to the details provided therein, but may be modified and practiced within the scope of the appended claims.

What is claimed is:

1. A system for controlling temperature in an equipment enclosure, comprising:
    an enclosure having a top side, side walls, a front side, and a back side, the enclosure being configured to receive multiple units of computer equipment;
    an air mover configured to draw air into the enclosure at the top side; and
    cooling panels having a width and coupled to the front side of the sidewalls of the enclosure, the width of the cooling panels extending in a direction of the sidewalls, the cooling panels being configured to receive the air from the air mover, the received air being cooled as it travels within the cooling panels in the direction of the sidewalls and toward the enclosure, the cooling panels including outlet ports oriented so that air that has been cooled is directed from the front side of the enclosure to the backside of the enclosure.

2. A system for controlling temperature in an equipment enclosure as recited in claim 1, further comprising:
    a manifold coupled to the top side of the enclosure, the manifold being configured to direct air received from the air mover to the cooling panels.

3. A system for controlling temperature in an equipment enclosure as recited in claim 1, wherein the cooling panels are defined by a first cooling panel and a second cooling panel, and each of the first and second cooling panels being coupled to the front side of the enclosure at the sidewalls.

4. A system for controlling temperature in an equipment enclosure as recited in claim 1, wherein the cooling panels that are coupled to the front side of the sidewalls are mechanically connected to the enclosure.

5. A system for controlling temperature in an equipment enclosure as recited in claim 1, wherein the cooling panels have walls defining a path.

6. A system for controlling temperature in an equipment enclosure as recited in claim 5, wherein the path in the cooling panels hold coolant tubes, the coolant tubes are configured to carry a cooling fluid, the cooling fluid being adjusted to set a cooling temperature within the path of the cooling panels.

7. A system for controlling temperature in an equipment enclosure as recited in claim 1, wherein the cooling panels have an outer wall and an inner wall, the inner wall including fins for enhancing cooling of the air.

8. A system for controlling temperature in an equipment enclosure as recited in claim 1, wherein the outlet ports in the cooling panels can be directionally adjusted to direct the air toward the computer equipment.

9. A system for controlling temperature in an equipment enclosure as recited in claim 1, further comprising:
 an air mover coupled to the backside of the enclosure, the air mover being configured to pull air from the front side of the enclosure toward the back side of the enclosure.

10. A system for controlling temperature in an equipment enclosure as recited in claim 9, further comprising:
 an exhaust duct coupled to the air mover that is coupled to the back side of the enclosure.

11. A system for controlling temperature in an equipment enclosure as recited in claim 1, further comprising:
 an air flow monitoring component for determining flow of the air within the cooling panels and the enclosure.

12. A system for controlling temperature in an equipment enclosure as recited in claim 1, further comprising a cooling system controller for regulating the flow of air through the cooling panels and the enclosure.

13. A method for controlling temperature in an equipment enclosure, comprising:
 providing an enclosure that is configured to hold multiple units of computer equipment;
 conditioning air to a desired cooled temperature, the air being conditioned in sidewall panels coupled to a front side of the enclosure;
 flowing the conditioned air from the sidewall panels and through the enclosure, the conditioned air experiencing an elevation in temperature upon passing through the enclosure when holding computer equipment in operation; and
 flowing air out of the enclosure from a backside of the enclosure that is opposite the front side having the sidewall panels, the air flowing out of the enclosure being less heated due to the conditioning of the air before flowing the air into the enclosure from the sidewall panels.

14. A method for controlling temperature in an equipment enclosure as recited in claim 13, further comprising:
 monitoring the air flowing out of the enclosure;
 if the air flowing out of the enclosure exceeds a level, then adjusting the desired cooled temperature before continuing to flow the conditioned air through the enclosure.

15. A method for controlling temperature in an equipment enclosure as recited in claim 13, wherein conditioning air to the desired cooled temperature includes flowing a coolant to the sidewall panels that couple to the front side of the enclosure.

16. A method for controlling temperature in an equipment enclosure as recited in claim 13, wherein the flowing of the air out of the enclosure includes fan pulling the air out of the enclosure from the backside of the enclosure.

\* \* \* \* \*